(12) United States Patent
Zhou

(10) Patent No.: US 10,002,869 B2
(45) Date of Patent: Jun. 19, 2018

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days. days.

(21) Appl. No.: 15/494,691

(22) Filed: Apr. 24, 2017

(65) Prior Publication Data

US 2018/0012888 A1    Jan. 11, 2018

(30) Foreign Application Priority Data

Jul. 7, 2016   (CN) .......................... 2016 1 0531674

(51) Int. Cl.
  *H01L 21/00*   (2006.01)
  *H01L 21/8238*   (2006.01)
  (Continued)

(52) U.S. Cl.
  CPC .... *H01L 27/0886* (2013.01); *H01L 21/26533* (2013.01); *H01L 21/76224* (2013.01); *H01L 29/0607* (2013.01); *H01L 29/0649* (2013.01)

(58) Field of Classification Search
  CPC ..... H01L 21/823431; H01L 21/823487; H01L 21/823821; H01L 21/823885;
  (Continued)

(56) References Cited

U.S. PATENT DOCUMENTS 8,497,171 B1    7/2013   Wu et al.
9,105,507 B2 *  8/2015   Wei .................... H01L 29/66795
(Continued)

OTHER PUBLICATIONS

The European Patent Office (EPO) The Extended European Search Report for 17179929.9 dated Nov. 7, 2017 9 Pages.
(Continued)

*Primary Examiner* — Hsien Ming Lee
(74) *Attorney, Agent, or Firm* — Anova Law Group, PLLC

(57) ABSTRACT

The present disclosure provides semiconductor structures and fabrication methods thereof. An exemplary fabrication method includes providing a plurality of fins on a semiconductor substrate; forming an anti-diffusion layer, containing anti-diffusion ions, in the fins; forming an anti-punch through layer, containing anti-punch through ions, in the fins, a top surface of the anti-punch through layer being below a top surface of the anti-diffusion layer, and the anti-diffusion layer preventing the anti-punch through ions from diffusing toward tops of the fins; and performing a thermal annealing process.

20 Claims, 7 Drawing Sheets

(51) Int. Cl.
*H01L 21/336* (2006.01)
*H01L 27/148* (2006.01)
*H01L 29/76* (2006.01)
*H01L 27/088* (2006.01)
*H01L 21/762* (2006.01)
*H01L 21/265* (2006.01)
*H01L 29/06* (2006.01)

(58) Field of Classification Search
CPC ............ H01L 29/785; H01L 29/78642; H01L 29/7926; H01L 29/66795; H01L 29/66545; H01L 27/0886; H01L 27/0924; H01L 27/10841
USPC ........ 438/156, 173, 192, 212, 268; 257/220, 257/263, 328, 330, 331
See application file for complete search history.

(56) References Cited

U.S. PATENT DOCUMENTS 9,299,618 B1* 3/2016 Cheng ............ H01L 21/823821
2015/0255456 A1* 9/2015 Jacob .................. H01L 27/0886
257/401

OTHER PUBLICATIONS

Okano K et al: "Process integration technology and device characteristics of CMOS FinFET on bulk silicon substrat with sub-10 nm fin width and 20 nm gate length", International Electron Devices Meetion Dec. 5-7, 2005, IEEE, IEEE, Piscataway, NJ. USA, Dec. 5, 2005(Dec. 5, 2005), pp. 721-724, XP010903585, DOI: 101109/ IEDM.2005.1609454 ISBN:978-0-7803-9268-7.

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610531674.3, filed on Jul. 7, 2016, the entirety of which is incorporated herein by reference.

FIELD OF THE INVENTION

The present invention generally relates to the field of semiconductor manufacturing and, more particularly, relates to semiconductor structures and fabrication methods thereof.

BACKGROUND

With the continuous increase of the integrate degree of semiconductor devices, the critical dimension of transistors has become smaller and smaller. Reducing the critical dimension of transistors allows more transistors on a chip; and enhances the properties of semiconductor devices. However, with the rapid reduction of the size of transistors, the thickness of the gate dielectric layer and the working voltage of the transistors may not be changed accordingly, which increases the difficulties in suppressing the short channel effect. Thus, the leakage current of the channel region of the transistor is increased.

The gate structures of fin field-effect transistors (FinFETs) are designed as fin-like three-dimensional (3D) architects. The channel regions of the FinFETs protrude from the surface of the semiconductor substrate to form the fins. The gate structures cover the top and side surfaces of the fins. Thus, the reverse-type layers are formed on the sides of the channel regions; and the "on/off" of the channel regions can be controlled from multiple sides of the channel regions. Such a design increases the control ability of the gate structures on the channel regions. Thus, the short channel effect can be effectively controlled. However, the existing FinFETs still have the short channel effect.

To further reduce the short channel effect of the semiconductor devices and reduce the leakage current of the channel regions, one approach is to perform an anti-punch through ion implantation process. Such an ion implantation process reduces the possibility of the source-drain punch through and the short channel effect.

However, the existing fabrication methods including the anti-punch through ion implanting process of semiconductor structures are easy to affect the properties of the semiconductor structures. The disclosed semiconductor structures and methods are directed to solve one or more problems set forth above and other problems in the art.

BRIEF SUMMARY OF THE DISCLOSURE

One aspect of the present disclosure includes a method for fabricating a semiconductor structure. The method includes providing a plurality of fins on a semiconductor substrate; forming an anti-diffusion layer, containing anti-diffusion ions, in the fins; forming an anti-punch through layer, containing anti-punch through ions, in the fins, a top surface of the anti-punch through layer being below a top surface of the anti-diffusion layer, and the anti-diffusion layer preventing the anti-punch through ions from diffusing toward tops of the fins; and performing a thermal annealing process.

Another aspect of the present disclosure includes a semiconductor structure. The semiconductor structure includes a plurality of fins formed on a semiconductor substrate; an anti-diffusion layer, containing anti-diffusion ions, formed in the fins; and an anti-punch through layer, containing anti-punch through ions, formed in the fins. A top surface of the anti-punch through layer is below a top surface of the anti-diffusion layer; and the anti-diffusion layer prevents the anti-punch through ions from diffusing toward tops of the fins.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

With the continuous shrinking of the fin size of FinFETs, a punch through phenomenon is easy to occur between the bottoms of the source regions and the drain regions of the FinFETs. That is, a short-circuit is easy to occur between the bottoms of the source regions and the drain regions of the FinFET structures to thus generate leakage current. To overcome the punch through between the source regions and the drain regions of the FinFET structures, one approach is to implant reverse type ions in the bottom regions of the fins between the source regions and the drain regions to isolate the bottoms of the source regions and the drain regions.

Figure 1:
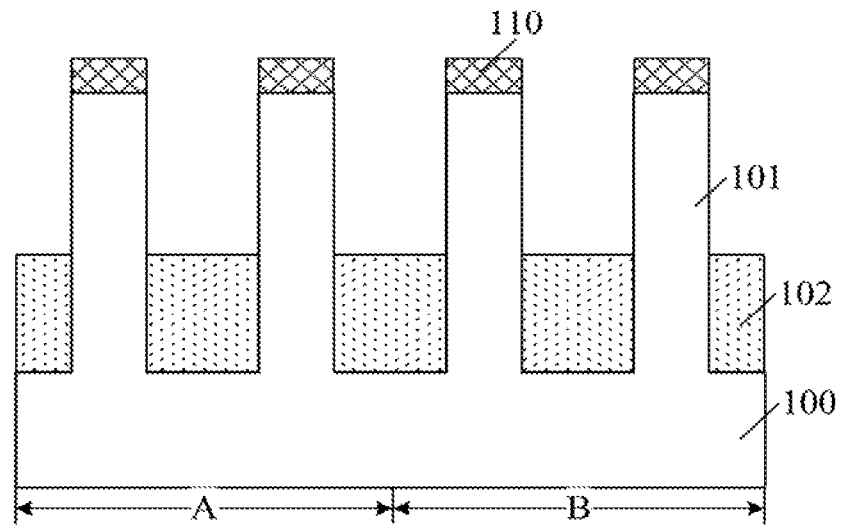
FIGS. 1-3 illustrate structures corresponding to certain stages of an existing fabrication process of a semiconductor structure.
Figure 2:
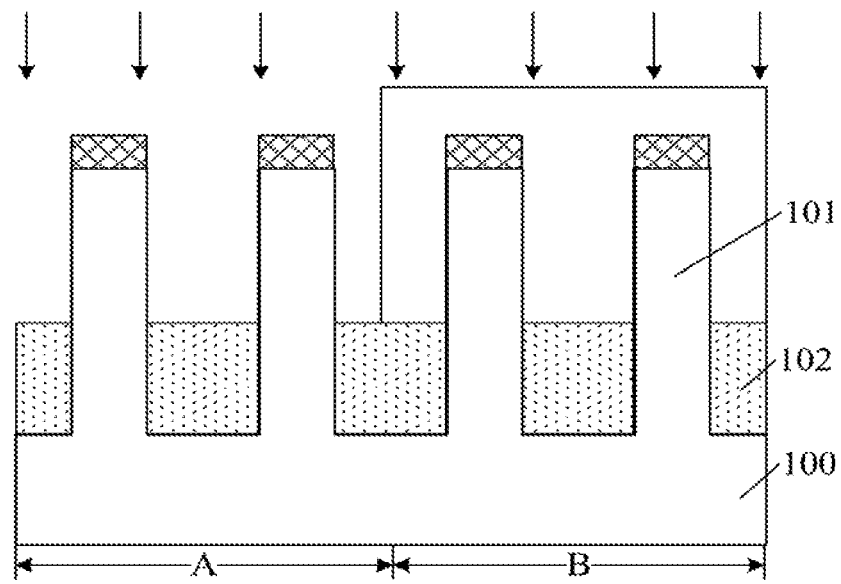
Figure 3:
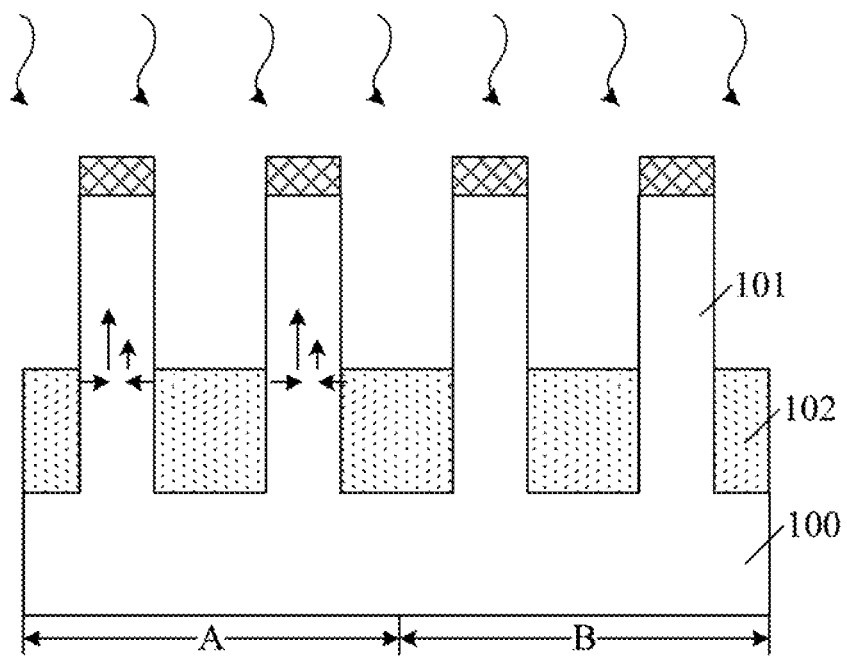

FIGS. 1-3 illustrate structures corresponding to certain stages of an existing fabrication method of a semiconductor structure. As shown in FIG. 1, the method includes providing a base substrate. The base substrate includes a semiconductor substrate 100; and a plurality of fins 101 formed on the semiconductor substrate 100. A hard mask layer 110 is formed on the tops of the fins 101. The semiconductor substrate 100 has a first transistor region A and a second transistor region B.

Further, isolation structures 102 are formed among the fins 101. The top surfaces of the isolation structures 102 are below the top surfaces of the fins 101.

Further, as shown in FIG. 2, an anti-punch through ion implantation process is performed to implant the anti-punch through ions in the isolation structures 102. Then, as shown in FIG. 3, after the anti-punch through ion implantation process, a thermal annealing process is performed to allow the anti-punch through ions to diffuse into the bottoms of the fins 101.

During the thermal annealing process, the anti-punch through ions may be easily diffused toward the tops of the fins 101. Thus, the threshold voltage of the subsequently formed transistors is increased. Accordingly, the performance of the transistors may be adversely affected.

The present disclosure provides a semiconductor structure and a fabrication method thereof. The fabrication method includes providing a base substrate having a semiconductor substrate and a plurality of fins formed on the semiconductor substrate; and forming an anti-diffusion layer containing anti-diffusion ions in the fins. The method may also include forming an anti-punch through layer with a top surface below a top surface of the anti-diffusion layer in the fins; and performing a thermal annealing process. The anti-punch through layer may have anti-punch through ions. The anti-diffusion layer may be used to prevent the anti-punch through ions from diffusing toward the tops of the fins.

In the disclosed methods, before performing the thermal annealing process, the anti-diffusion layer may be formed in the fins. The anti-diffusion layer may be able to prevent the anti-punch through ions from diffusing toward the tops of the fins during the thermal annealing process. Thus, the amount of the anti-punch through ions diffusing into the channel regions may be reduced. Therefore, the disclosed methods may be able to reduce the effects of the anti-punch through ions to the threshold voltage of the transistors; and the performance of the semiconductor structures may be enhanced.

Figure 11:
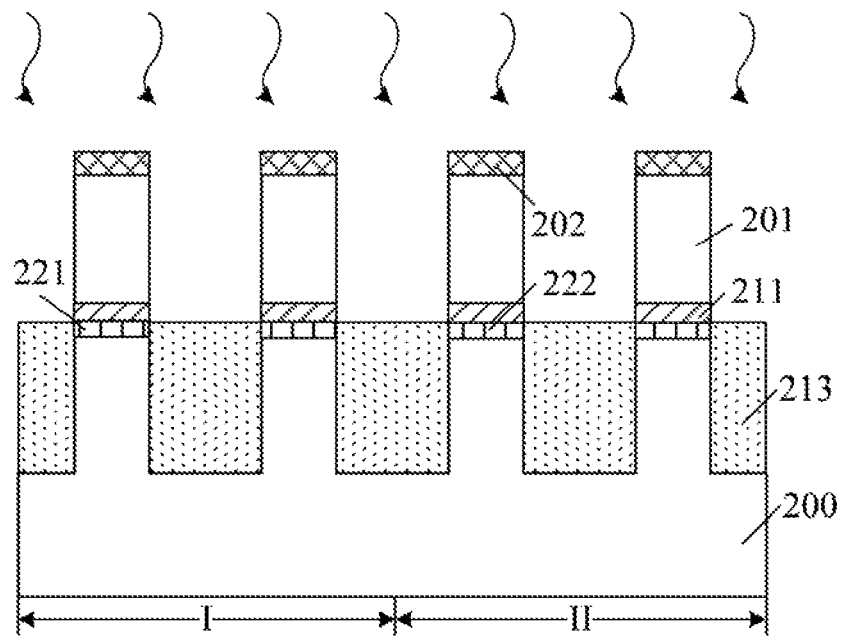
Figure 12:
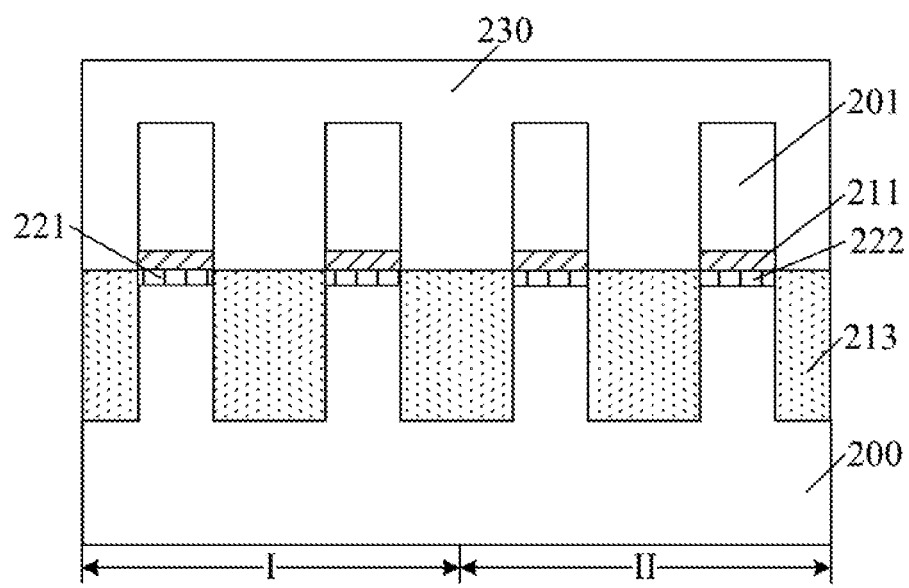
Figure 13:
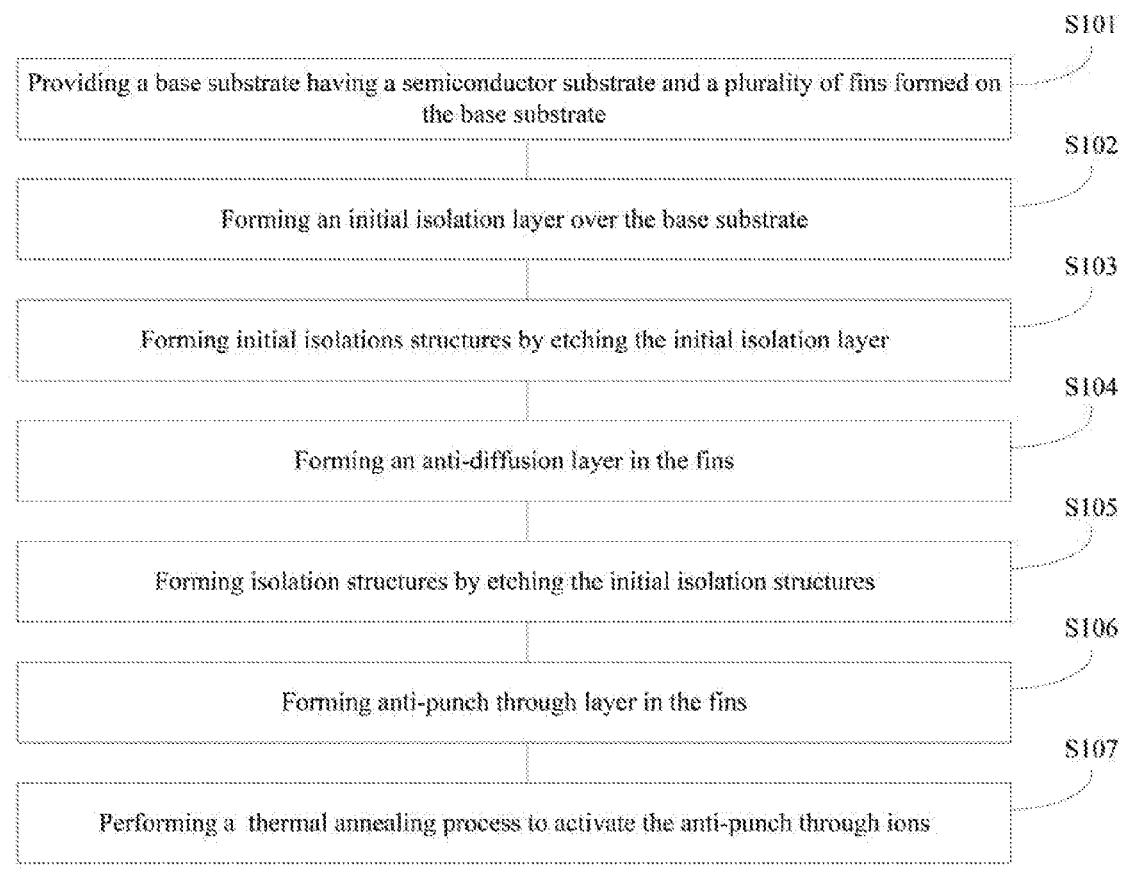
FIG. 13 illustrates an exemplary fabrication process of a semiconductor structure consistent with the disclosed embodiments.

FIG. 13 illustrates an exemplary fabrication process of a semiconductor structure consistent with the disclosed embodiments. FIGS. 4-12 illustrate semiconductor structures corresponding to certain stages of the exemplary fabrication process.

Figure 4:
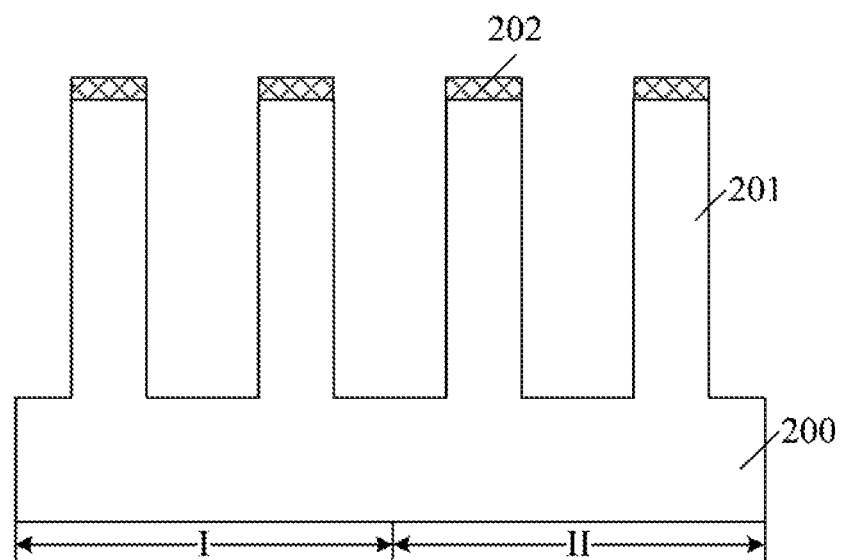
FIGS. 4-12 illustrate structures corresponding to certain stages of an exemplary fabrication process of a semiconductor structure consistent with the disclosed embodiments.

As shown in FIG. 13, at the beginning of the fabrication process, a base substrate with certain structures is provided (S101). FIG. 4 illustrates a corresponding semiconductor structure.

As shown in FIG. 4, a base substrate is provided. The base substrate may include a semiconductor substrate 200 and a plurality of fins 201 formed on the semiconductor substrate 200.

In one embodiment, the base substrate may have a first transistor region I and a second transistor region II. In some embodiments, the base substrate may only have a first transistor region, or a second transistor region.

In one embodiment, the first transistor region I may be used to form NMOS transistors; and the second transistor region II may be used to form PMOS transistors. In another embodiment, the first transistor region may be used to form PMOS transistors; and the second transistor region II may be used to form NMOS transistors.

In one embodiment, as shown in FIG. 4, a hard mask layer 202 may be formed on the tops of the fins 201. The hard mask layer 202 may be able to protect the fins 201 during the subsequent anti-punch through ion implantation process; and the effect of the anti-punch through ions to the transistors may be reduced.

In one embodiment, the process for forming the base substrate may include providing an initial substrate; forming the patterned hard mask layer 202 on the initial substrate; and patterning the initial substrate using the patterned hard mask layer 202 as a mask. Thus, the semiconductor substrate 200 and the fins 201 may be formed. The fins 201 may be used to form the channel regions of the transistors.

Figure 5:
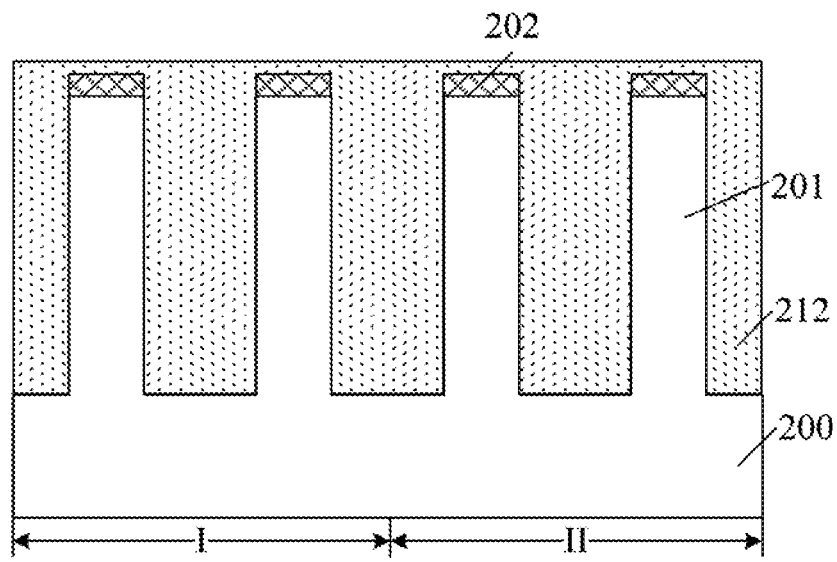

Returning to FIG. 13, after forming the fins 201, an initial isolation layer may be formed (S102). FIG. 5 illustrates a corresponding semiconductor structure.

As shown in FIG. 5, an initial isolation layer 212 is formed over the semiconductor substrate 200. The top surface of the initial isolation layer 212 may be above the top surfaces of the fins 201. The initial isolation layer 212 may be used to subsequently form isolation structures.

The initial isolation layer 212 may be made of any appropriate material(s), such as silicon oxide, or silicon oxynitride, etc. Various processes may be used to form the initial isolation layer 212, such as a chemical vapor deposition (CVD) process, a physical vapor deposition (PVD) process, a flowable CVD (FCVD) process, or an atomic layer deposition (ALD) process, etc.

Figure 6:
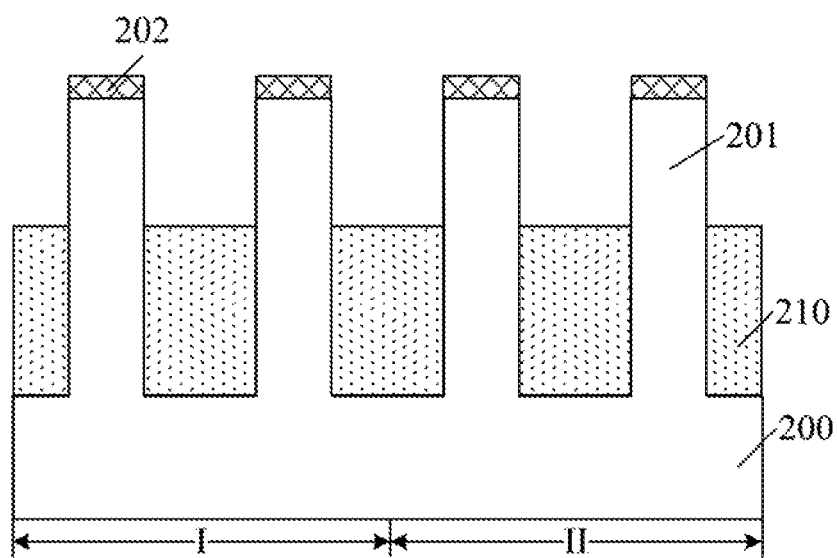

Returning to FIG. 13, after forming the initial isolation layer 202, initial isolation structures may be formed (S103). FIG. 6 illustrates a corresponding semiconductor structure.

As shown in FIG. 6, the initial isolation structures 210 are formed among the fins 201. The initial isolation structures 210 may be formed by etching the initial isolation layer 212 to cause the top surface of the initial isolation layer 212 to be below the tops of the fins 201. The initial isolation structures 210 may be used as media for subsequently doping the fins 201.

In one embodiment, the initial isolation structures 210 are made of a same material as that of the initial isolation layer 212. That is, the initial isolation structures 210 may be made of silicon oxide, or silicon oxynitride, etc. Various processes may be used to etch the initial isolation layer 212, such as a dry etching process, or a wet etching process, etc.

Figure 7:
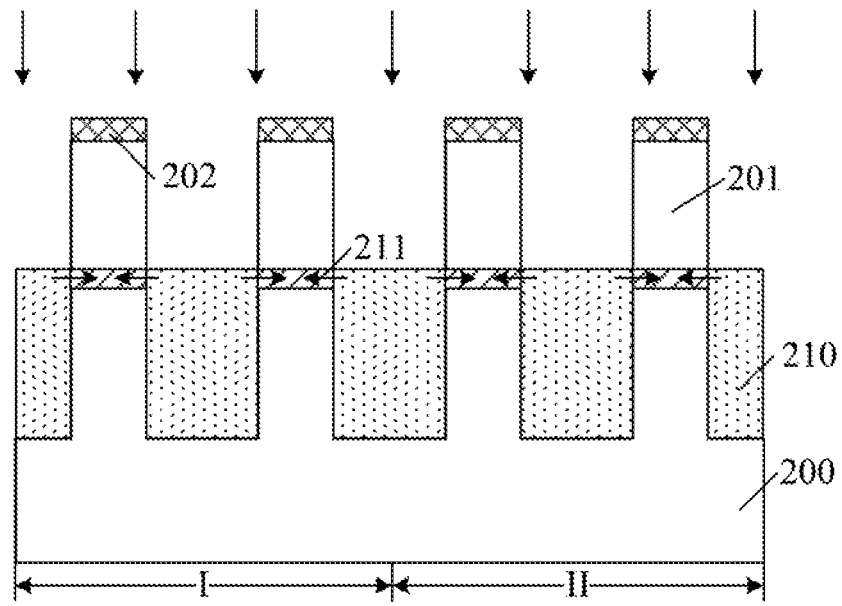

Returning to FIG. 13, after forming the initial isolation structures 210, an anti-diffusion layer may be formed (S104). FIG. 7 illustrates a corresponding semiconductor structure.

As shown in FIG. 7, an anti-diffusion ion implantation process is performed to the initial isolation structures 210; and an anti-diffusion layer 211 may be formed in the fins 201. The anti-diffusion layer 211 may be used to prevent the anti-punch through ions in the subsequently formed anti-punch through layer from diffusing toward the tops of the fins 201.

The anti-diffusion ions may be implanted into the initial isolation structures 210; and the anti-diffusion ions may be easy to diffuse into the fins 201. Thus, the anti-diffusion layer 211 may be formed in the fins 201. The anti-punch through layer may be subsequently formed under the anti-diffusion layer 211. Thus, the anti-diffusion layer 211 may be able to prevent the anti-punch through ions from diffusing toward the tops of the fins 201.

In one embodiment, the anti-diffusion layer 211 may have anti-diffusion ions. The anti-diffusion ions may be the group IV ions. The electron number of the outer shell of the group IV elements may be identical to the electron number of the outer shell of the element of the fins 201. Thus, the anti-diffusion ions may be uneasy to form majority carriers in the fins 201. Accordingly, the conductivity of the fins 201 may not be changed.

Further, the anti-diffusion ions may be uneasy to form bonds with the atoms of the fins 201. The ions uneasy to form bonds with the atoms of the fins 201 may be uneasy to be activated during the thermal annealing process. Thus, the anti-diffusion ions uneasy to form bonds with the atoms of the fins 201 may not change the conductivity of the fins 201.

Further, the anti-diffusion ions may enter into interstitial lattice sites of the atoms of the fins 201. Thus, the anti-diffusion layer 211 may be able to prevent the anti-punch through ions of the subsequently formed anti-punch through layer from interstitially diffusing toward the tops of the fins 201. Accordingly, the performance of the semiconductor structure may be improved.

In one embodiment, the anti-diffusion ions include one or more types of C ions, Ge ions and N ions. After the C ions, G ions and N ions enter into the interstitial sites of the atoms of the fins 201, they may be able to prevent the anti-punch through ions from diffusing toward the tops of the fins 201. Further, the N atoms may be uneasy to activate during the thermal annealing process. Thus, they may not affect the conductivity of the fins 201. The C ions and Ge ions are group IV elements, they may also be uneasy to activate; and may be uneasy to affect the conductivity of the fins 201.

The thickness of the anti-diffusion layer 211 may be any appropriate value. If the thickness of the anti-diffusion layer 211 is too large, the conductivity of the fins 201 may be affected; and the performance of the transistors may be reduced. If the thickness of the anti-diffusion layer 211 is too small, it may be difficult to prevent the anti-punch through ions from diffusing toward the tops of the fins 201. Thus, in one embodiment, the thickness of the anti-diffusion layer 211 may be in a range of approximately 10 Å-50 Å.

The doping concentration of the anti-diffusion layer 211 may be any appropriate value. If the concentration is too high, the conductivity of the fins 201 may be easily affected; and the performance of the transistors may be reduced. If the concentration is too low, it may be difficult to prevent the anti-punch through ions from diffusing toward the tops of the fins 201. Thus, in one embodiment, the concentration of the anti-diffusion ions of the anti-diffusion layer 211 may be in a range of approximately $1.0E13$ atoms/cm$^2$-$1.0E16$ atoms/cm$^2$.

In one embodiment, the energy of the anti-diffusion ion implantation process may be in a range of approximately 1 KeV-300 KeV. The dosage of the anti-diffusion ion implantation process may be in a range of approximately $1.0E12$ atoms/cm$^2$-$1.0E16$ atoms/cm$^2$.

Figure 8:
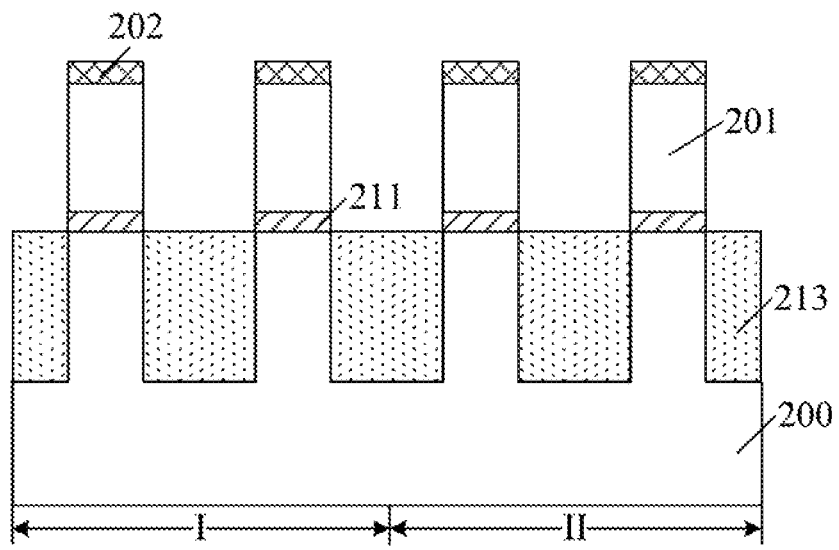

Returning to FIG. 13, after forming the anti-diffusion layer 211, isolation structures may be formed (S105). FIG. 8 illustrates a corresponding semiconductor structure.

As shown in FIG. 8, a partial thickness of the initial isolation structures 210 (referring to FIG. 7) are removed; and the isolation structures 213 may be formed. The isolation structures 213 may be used as media for subsequently performing an anti-punch through ion implantation process.

By removing the partial thickness of the initial isolation structures 210, the top surfaces of the isolation structures 213 may be lower than the initial isolation structures 210. Correspondingly, the top surface of the subsequently formed anti-punch through layer may be below the top surface of the anti-diffusion layer 211. Thus, the anti-diffusion layer 211 may be able to prevent the anti-punch through ions from diffusing toward the tops of the fins 201.

The removed partial thickness of the initial structures 210 may be any appropriate value. If the removed partial thickness is too large, the subsequently formed anti-punch through layer and the anti-diffusion layer 211 may have a relatively large distance. The anti-punch through ions may be easy to diffuse into the portions of the fins 201 between the anti-punch through layer and the anti-diffusion layer 211; and the performance of the semiconductor structures may be affected. If the removed partial thickness is too small, the thickness of the anti-diffusion layer 211 on the anti-punch through layer may be relatively small; the anti-diffusion barrier layer 211 may be unable to prevent the anti-punch through ions from diffusing toward the tops of the fins 201. Thus, in one embodiment, the removed partial thickness may be in a range of approximately 15 Å-60 Å.

In one embodiment, as shown in FIG. 8, the top surfaces of the isolation structures 213 level with the bottom surface of the anti-diffusion layer 211. Correspondingly, the top surface of the subsequently formed anti-punch through layer may level with the bottom surface of the anti-diffusion layer 211.

In some embodiments, the top surface of the anti-punch through layer may be below the bottom surface of the anti-diffusion layer; or the top surface of the anti-punch through layer is above the top surface of the anti-diffusion layer and the bottom surface of the anti-punch through layer is below the top surface of the anti-diffusion layer.

Various processes may be used to remove the partial thickness of the initial isolation structures 210, such as a dry etching process, or a wet etching process, etc.

Figure 9:
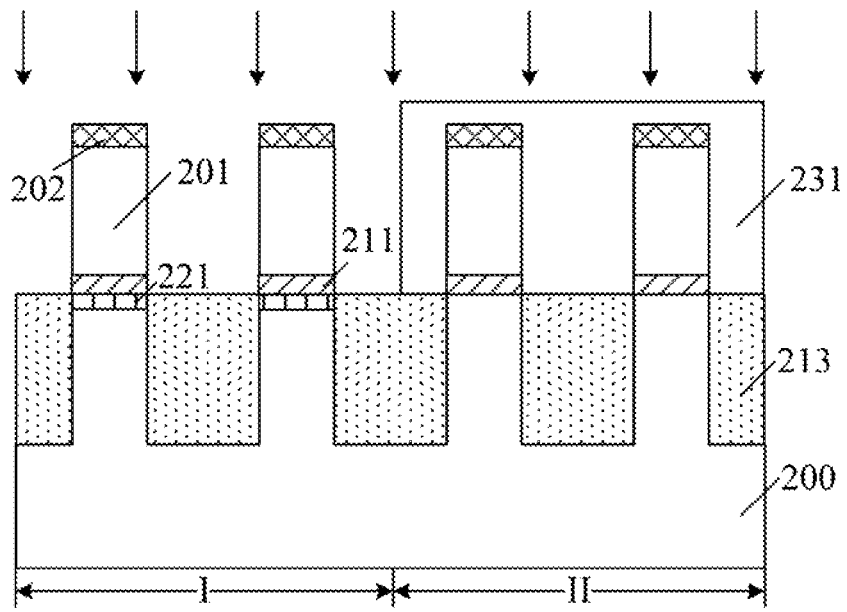
Figure 10:
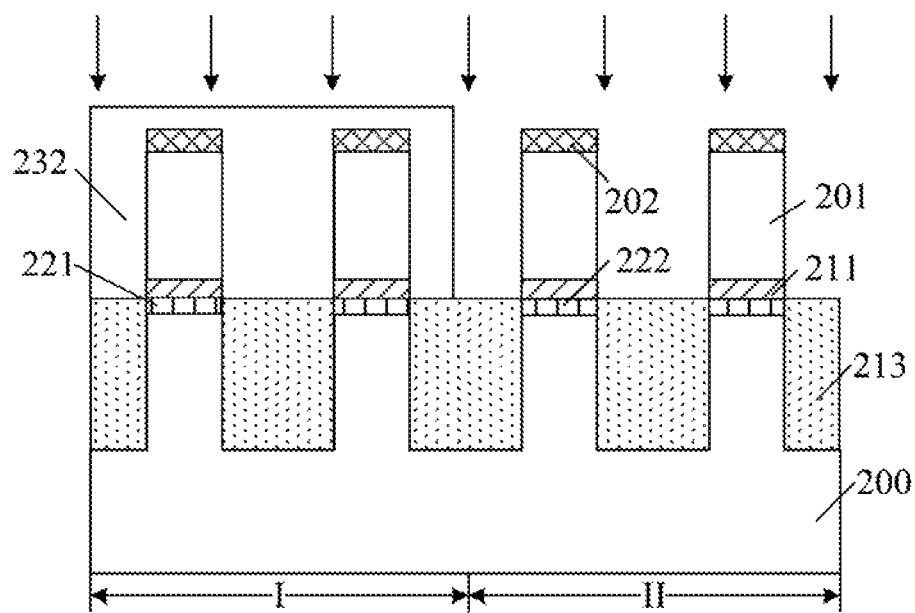

Returning to FIG. 13, after forming the isolation structures 213, an anti-punch through layer may be formed (S106). FIGS. 9-10 illustrate corresponding semiconductor structures.

As shown in FIGS. 9-10, an anti-punch through layer is formed. In one embodiment, the base substrate includes the first transistor region I and the second transistor region II. Thus, the anti-punch through layer may include a first anti-punch through layer 221 in the first transistor region I and a second punch through layer 222 in the second transistor region II under the anti-diffusion layer 211. In some embodiments, the base substrate may only include a first transistor region or a second transistor region, the anti-punch layer may be one layer.

The anti-punch through layer may be formed by performing one or more steps of anti-punch through ion implantation process on the isolation structures 213. The anti-punch through ions implanted into the isolation structures 213 may diffuse into the fins 201 to form the anti-punch through layer. The anti-punch through layer may be able to reduce the punch through probability between the source regions and the drain regions of the transistors.

In one embodiment, as shown in FIGS. 9-10, the top surface of the anti-punch through layer may be below the top surface of the anti-diffusion layer 211. The anti-punch through layer may have the anti-punch through ions. Thus, the anti-diffusion layer 211 may be able to prevent the anti-punch through ions from diffusing toward the tops of the fins 201. The anti-punch through layer may be used to reduce the source-drain punch through probability of the transistors; and reduce the leakage current in the channel regions of the transistors.

Referring to FIGS. 9-10, because the base substrate may include the first transistor region I and the second transistor region II, the anti-punch through ion implantation process may include performing a first anti-punch through ion implantation process to the isolation structures 213 in the first transistor region I to form the first anti-punch through layer 221; and performing a second anti-punch through ion implantation process to the isolation structures 213 in the second region II to form the second anti-punch through layer 222.

In some embodiments, the base substrate may only include the first transistor region and the second transistor region. Thus, the anti-punch through ion implantation process may only include a first anti-punch through ion implantation process performed on the isolation structures in the first transistor region to form a first anti-punch through layer, or a second anti-punch through ion implantation process performed on the isolation structures in the second transistor region to form a second anti-punch through layer.

Specifically, as shown in FIG. 9, the first anti-punch through ion implantation process is performed on the isolation structures 211 in the first transistor region I; and the first anti-punch through layer 221 may be formed in the fins 201 in the first transistor region I. The first anti-punch through layer 221 may be used to reduce the source-drain punch through probability in the transistors in the first transistor region I.

The first anti-punch through ion implantation process may include forming a first photoresist layer 231 over the second transistor region II; and performing the first anti-punch through ions implantation process using the first photoresist layer 231 as a mask. Thus, the first anti-punch through layer 221 may be formed in the fins 201 in the first region I.

The ions implanted into the isolation structures 211 to form the first anti-punch through layer 221, i.e., the ions in the first anti-punch through layer 211, may be referred to as first anti-punch through ions. In one embodiment, the first transistor region I may be used to form NMOS transistors, the first anti-punch through ions may be B ions, or F ions, etc. In some embodiments, the first transistor region I may be used to form PMOS transistors, the first anti-punch through ions may be P ions, or As ions.

The thickness of the first anti-punch through layer 221 may be any appropriate value. If the thickness of the first anti-punch through layer 221 is too large, it may be easy to have a material waste issue. If the thickness of the first anti-punch through layer 221 is too small, it may be difficult to achieve the anti-punch through function. Thus, in one embodiment, the thickness of the first anti-punch through layer 221 is in a range of approximately 20 Å-60 Å.

The concentration of the anti-punch through ions in the first anti-punch through layer 221 may be any appropriate value. If the concentration of the anti-punch through ions in the first anti-punch through layer 221 is too high, the anti-punch through ions may be easy to punch through the anti-diffusion layer 211 to diffuse toward the tops of the fins 201; and the performance of the transistors may be affected. If the concentration of the anti-punch through ions in the first anti-punch through layer 221 is too low, the anti-punch through function of the anti-punch through layer 221 may not be achieved. That is, the first anti-punch through layer 221 may be unable to prevent the punch through between the source regions and the drain regions of the transistors. Thus, in one embodiment, the concentration of the anti-punch through ions in the first anti-punch through layer 221 may be in a range of approximately 1.0E13 atoms/cm$^3$-1.0E15 atoms/cm$^3$.

In one embodiment, the dosage of the first anti-punch through ion implantation process may be in a range of approximately 1.0E13 atoms/cm$^2$-1.0E15 atoms/cm$^2$. The energy of the first anti-punch through ion implantation process may be in a range of 5 keV-100 keV.

Further, as shown in FIG. 10, after performing the first anti-punch through ion implantation process, the second anti-punch through ion implantation process is performed on the isolation structures 213 in the second transistor region II; and the second anti-punch through layer 222 may be formed in the fins 201 in the second transistor region II. The second anti-punch through layer 222 may be used to reduce the source-drain punch through probability in the transistors in the second transistor region II.

The second anti-punch through ion implantation process may include forming a second photoresist layer 232 over the first transistor region I; and performing the second anti-punch through ions implantation process using the second photoresist layer 232 as a mask. Thus, the second anti-punch through layer 222 may be formed in the fins 201 in the second region II.

The ions implanted into the isolation structures 213 to form the second anti-punch through layer 222, i.e., the ions in the second anti-punch through layer 222, may be referred to as second anti-punch through ions. In one embodiment, the second transistor region II may be used to form PMOS transistors, the second anti-punch through ions may be P ions, or As ions, etc. In some embodiments, the second transistor region II may be used to form NMOS transistors, the second anti-punch through ions may be B ions, or F ions.

The thickness of the second anti-punch through layer 222 may be any appropriate value. If the thickness of the second anti-punch through layer 222 is too large, it may be easy to have a material waste issue. If the thickness of the second anti-punch through layer 222 is too small, it may be difficult to achieve the anti-punch through function. Thus, in one embodiment, the thickness of the second anti-punch through layer 222 is in a range of approximately 20 Å-60 Å.

The concentration of the second anti-punch through ions in the second anti-punch through layer 222 may be any appropriate value. If the concentration of the second anti-punch through ions in the second anti-punch through layer 222 is too high, the second anti-punch through ions may be easy to punch through the anti-diffusion layer 211 to diffuse toward the tops of the fins 201; and the performance of the transistors may be affected. If the concentration of the second anti-punch through ions in the second anti-punch through layer 222 is too low, the anti-punch through function of the second anti-punch through layer 222 may not be achieved. That is, the second anti-punch through layer 222 may be unable to prevent the punch through between the source regions and the drain regions of the transistors. Thus, in one embodiment, the concentration of the second anti-punch through ions in the second anti-punch through layer 222 may be in a range of approximately 1.0E13 atoms/cm$^3$-1.0E15 atoms/cm$^3$.

In one embodiment, the dosage of the second anti-punch through ion implantation process may be in a range of approximately 1.0E13 atoms/cm$^2$-1.0E15 atoms/cm$^2$. The energy of the second anti-punch through ion implantation process may be in a range of 5 keV-100 keV.

In one embodiment, the top surface of the anti-punch through layer levels with the bottom surface of the anti-diffusion layer. In some embodiments, the top surface of the anti-punch through layer may be below the bottom surface of the anti-diffusion layer. In other embodiments, the top surface of the anti-punch through layer may be above the top surface of the anti-diffusion layer; and the bottom surface of the anti-punch through layer be below the top surface of the anti-diffusion layer.

Returning to FIG. 13, after forming the anti-punch through layer, a thermal annealing process may be performed (S107). FIG. 11 illustrates a corresponding semiconductor structure.

As shown in FIG. 11, a thermal annealing process is performed to activate the anti-punch through ions. The activated anti-punch through ions may be able to prevent the source-drain punch through.

During the thermal annealing process, the anti-diffusion layer 211 may be able to prevent the anti-punch through ions in the anti-punch through layer from diffusing toward the tops of the fins 201. The effect of the anti-punch through ions to the transistors may be reduced; and the performance of the semiconductor structure may be improved.

The temperature of the thermal annealing process may be any appropriate value. In one embodiment, the temperature of the thermal annealing process may be in a range of approximately 950° C.-1050° C.

After the thermal annealing process, as shown in FIG. 12, a gate structure 230 crossing over the fins 201 may be formed. The gate structure 230 may cover portions of the side and top surfaces of the fins 201.

In some embodiments, before forming the anti-diffusion layer and the anti-punch through layer, isolation structures may be formed over the base substrate. The top surfaces of the isolation structures may be lower than the top surfaces of the fins.

Then, an anti-punch through ion implantation process may be performed on the isolations structures. Thus, the anti-punch through layer may be formed in the fins.

After forming the anti-punch through layer, a doping layer may be formed on the isolation structures. The doping layer may have anti-diffusion ions.

The doping layer may be formed by a CVD process. During the CVD process, the anti-diffusion ions may be doped into the doping layer, and the anti-diffusion ions may diffuse into the fins; and the anti-diffusion layer may be formed in the fins. In one embodiment, the doping layer may be made of silicon oxide doped with the anti-diffusion ions.

In other embodiments, after forming the anti-diffusion layer, the doping layer may be removed to expose the surfaces of the isolation structures. After removing the doping layer, an anti-punch through ion implantation process may be performed on the isolation structures to form the anti-punch through layer.

Thus, according to the disclosed fabrication methods of the semiconductor structure, before the thermal annealing process, an anti-diffusion layer may be formed in the fins. The anti-diffusion layer may be able to prevent the anti-punch through ions from diffusing toward the tops of the fins. Thus, the amount of the anti-punch through ions diffusing into the channel regions of the transistors may be reduced. Accordingly, the disclosed methods for fabricating the semiconductor structures may be able to reduce the effect of the anti-punch through ions to the threshold voltage of the transistors. Therefore, the performance of the semiconductor structure may be improved.

Thus, a semiconductor structure may be formed by the disclosed methods and processes. FIG. 12 illustrates a corresponding semiconductor structure.

As shown in FIG. 12, the semiconductor structure includes a base substrate having a semiconductor substrate 200 and a plurality of fins 201 formed on the semiconductor substrate 200; an anti-diffusion layer 211 having anti-diffusion ions formed in the fins 201; and an anti-punch through layer including a first anti-punch through layer 221 forming the fins in the first transistor region I and a second anti-punch through layer 222 formed in the fins 201 in the second transistor region II. The bottom surface of the anti-punch through layer may be below the top surface of the anti-diffusion layer 211. The anti-punch through layer may have anti-punch through ions; and the anti-diffusion layer 211 may be used to prevent the anti-punch through ions from diffusing toward the tops of the fins 201.

In one embodiment, the base substrate may include a first transistor region I and a second transistor region II. In some embodiments, the base substrate may only include a first transistor region, or a second transistor region.

In one embodiment, the first transistor region I may be used to form NMOS transistors; and the second transistor region II may be used to form PMOS transistors. In some embodiments, the first transistor region may be used to form PMOS transistors; and the second transistor region may be used to form NMOS transistors.

In one embodiment, a hard mask layer 202 may be formed on the tops of the fins 201. The hard mask layer 202 may be able to protect the fins 201 during the subsequent anti-punch through ion implantation process; and the effect of the anti-punch through ions to the transistors may be reduced.

In one embodiment, the anti-diffusion layer 211 may have anti-diffusion ions. The anti-diffusion ions may be the group IV ions, or the element uneasy to form bonds with the fins. The electron number of the outer shell of the group IV element may be identical to the electron number of the most out shell of the element of the fins 201. Thus, the anti-diffusion ions may be uneasy to form majority carriers in the fins 201. Accordingly, the conductivity of the fins 201 may not be changed.

Further, the anti-diffusion ions may be uneasy to form bonds with the atoms of the fins 201. The ions uneasy to form bonds with the atoms of the fins 201 may be uneasy to activate during the thermal annealing process. Thus, the anti-diffusion ions uneasy to form bonds with the atoms of the fins 201 may not change the conductivity of the fins 201.

Further, the anti-diffusion ions may enter into interstitial lattice sites of the atoms of the fins 201. Thus, the anti-diffusion layer 211 may be able to prevent the anti-punch through ions of the subsequently formed anti-punch through layer from interstitially diffusing toward the tops of the fins 201. Accordingly, the performance of the semiconductor structure may be improved.

The anti-diffusion layer 211 may be able to prevent the anti-punch through ions from diffusing toward the tops of the fins 201 during the subsequent thermal annealing process. Thus, the amount of the anti-punch through ions diffusing into the channel regions of the transistors may be reduced; and the effect of the anti-punch through ions to the threshold voltage of the transistors may be reduced. Therefore, the performance of the semiconductor structure may be improved.

The thickness of the anti-diffusion layer 211 may be any appropriate value. If the thickness of the anti-diffusion layer 211 is too large, the conductivity of the fins 201 may be affected; and the performance of the transistors may be reduced. If the thickness of the anti-diffusion layer 211 is too small, it may be difficult to prevent the anti-punch through ions from diffusing toward the tops of the fins 201. Thus, in one embodiment, the thickness of the anti-diffusion layer 211 may be in a range of approximately 10 Å-50 Å.

The doping concentration of the anti-diffusion layer 211 may be any appropriate value. If the concentration is too high, the conductivity of the fins 201 may be easily affected; and the performance of the transistors may be reduced. If the concentration is too low, it may be difficult to prevent the anti-punch through ions from diffusing toward the tops of the fins 201. Thus, in one embodiment, the concentration of the anti-diffusion ions of the anti-diffusion layer 211 may be in a range of approximately $1.0E13$ atoms/cm$^2$-$1.0E16$ atoms/cm$^2$.

In one embodiment, the base substrate includes the first transistor region I and the second transistor region II. Thus, the anti-punch through layer may include the first anti-punch through layer 221 in the first region I and a second punch through layer 222 in the second transistor region II under the anti-diffusion layer 211. The first anti-punch through layer 221 may have first anti-punch through ions; and the second anti-punch through layer 222 may have second anti-punch through ions. In some embodiments, the base substrate may only include a first transistor region, or a second transistor region, the anti-punch layer may be one layer; a first anti-punch through layer in the first transistor region, or a second anti-punch through layer in the second transistor region.

In one embodiment, the first transistor region I may be used to form NMOS transistors, the first anti-punch through ions may be B ions, or F ions, etc. In some embodiments, the first transistor region I may be used to form PMOS transistors, the first anti-punch through ions may be P ions or As ions.

The thickness of the first anti-punch through layer 221 may be any appropriate value. If the thickness of the first anti-punch through layer 221 is too large, it may be easy to have a material waste issue. If the thickness of the first anti-punch through layer 221 is too small, it may be difficult to achieve the anti-punch through function. Thus, in one embodiment, the thickness of the first anti-punch through layer 221 is in a range of approximately 20 Å-60 Å.

The concentration of the anti-punch through ions in the first anti-punch through layer 221 may be any appropriate value. If the concentration of the anti-punch through ions in the first anti-punch through layer 221 is too high, the anti-punch through ions may be easy to punch through the anti-diffusion layer 211 to diffuse toward the tops of the fins 201; and the performance of the transistors may be affected. If the concentration of the anti-punch through ions in the first anti-punch through layer 221 is too low, the anti-punch through function of the anti-punch through layer 221 may not be achieved. That is, the first anti-punch through layer 221 may be unable to prevent the punch through between the source regions and the drain regions of the transistors. Thus, in one embodiment, the concentration of the anti-punch through ions in the first anti-punch through layer 221 may be in a range of approximately 1.0E13 atoms/cm-1.0E15 atoms/cm$^3$.

The second anti-punch through layer 222 may be used to reduce the source-drain punch through probability in the transistors in the second transistor region II. In one embodiment, the second transistor region II may be used to form PMOS transistors, the second anti-punch through ions may be P ions, or As ions, etc. In some embodiments, the second transistor region II may be used to form NMOS transistors, the second anti-punch through ions may be B ions or F ions.

The thickness of the second anti-punch through layer 222 may be any appropriate value. If the thickness of the second anti-punch through layer 222 is too large, it may be easy to have a material waste issue. If the thickness of the second anti-punch through layer 222 is too small, it may be difficult to achieve the anti-punch through function. Thus, in one embodiment, the thickness of the second anti-punch through layer 222 is in a range of approximately 20 Å-60 Å.

The concentration of the second anti-punch through ions in the second anti-punch through layer 222 may be any appropriate value. If the concentration of the second anti-punch through ions in the second anti-punch through layer 222 is too high, the second anti-punch through ions may be easy to punch through the anti-diffusion layer 211 to diffuse toward the tops of the fins 201; and the performance of the transistors may be affected. If the concentration of the second anti-punch through ions in the second anti-punch through layer 222 is too low, the anti-punch through function of the second anti-punch through layer 222 may not be achieved. That is, the second anti-punch through layer 222 may be unable to prevent the punch through between the source regions and the drain regions of the transistors. Thus, in one embodiment, the concentration of the second anti-punch through ions in the second anti-punch through layer 222 may be in a range of approximately 1.0E13 atoms/cm$^3$-1.0E15 atoms/cm$^3$.

To cause the anti-diffusion layer 211 to be able to prevent the anti-punch through ions from diffusing toward the tops of the fins 201, the top surface of the anti-punch layer may be below the top surface of the anti-diffusion layer 211. Specially, in one embodiment, the top surface of the anti-punch through layer levels with the top surface of the anti-diffusion layer 211.

In some embodiments, the top surface of the anti-punch through layer may be below the bottom surface of the anti-diffusion layer. In other embodiments, the top surface of the anti-punch through layer may be above the top surface of the anti-diffusion layer; and the bottom surface of the anti-punch through layer may be below the top surface of the anti-diffusion layer.

If the distance between the top surface of the anti-punch through layer and the top surface of the anti-diffusion layer 211 is too large, the top surface of the anti-punch through layer and the bottom surface of the anti-diffusion layer 211 may have a relatively large distance. The anti-punch through ions may be easy to diffuse into the portions of the fins 201 between the anti-punch through layer and the anti-diffusion layer 211; and the performance of the semiconductor structure may be affected. If the distance between the top surface of the anti-punch through layer and the top surface of the anti-diffusion layer 211 is too small, the thickness of the portion of the anti-diffusion layer 211 on the anti-punch through layer may be relatively small, the anti-diffusion barrier layer 211 may be unable to prevent the anti-punch through ions from diffusing toward the tops of the fins 201. Thus, in one embodiment, the distance between the top surface of the anti-punch through layer and the top surface of the anti-diffusion layer 211 may be in a range of approximately 10 Å-40 Å.

Further, the semiconductor structure may also include isolation structures 213 formed on the semiconductor substrate 200. The isolation structures 213 may be used to electrically insulate the fins 201.

In one embodiment, the top surfaces of the isolation structures 213 may be above the top surface of the anti-punch through layer, or level with the top surface of the anti-punch through layer. In one embodiment, the top surfaces of the isolation structures 213 level with the top surface of the anti-punch through layer. If the top surfaces of the isolation structures 213 are below the top surface of the anti-punch through layer, the doping ions in the channel regions of the transistor may diffuse into the anti-punch through layer. The anti-punch through ions may be verse-type ions; and may be easy to increase the threshold voltage of the transistors. In one embodiment, the isolation structures 213 may be made of silicon oxide, or silicon oxynitride.

Further, the semiconductor structures may also include a gate structure crossing over the fins 201. The gate structure 230 may cover portions of side and top surfaces of the fins 201.

Therefore, according to the disclosed embodiments, an anti-diffusion layer may be formed in the fins. The anti-diffusion layer may be able to prevent the anti-punch through ions from diffusing toward the tops of the fins during the thermal annealing process. Thus, the anti-punch through ions diffusing into the channel regions of the transistors may be reduced; and the performance of the semiconductor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a plurality of fins on a semiconductor substrate;
   forming an anti-diffusion layer, containing anti-diffusion ions, in the fins;
   forming an anti-punch through layer after forming the anti-diffusion layer, containing anti-punch through ions, in the fins, a top surface of the anti-punch through layer being below a top surface of the anti-diffusion layer, and the anti-diffusion layer preventing the anti-punch through ions from diffusing toward tops of the fins; and
   performing a thermal annealing process.

2. The method according to claim 1, wherein:
   the anti-diffusion ions include one or more of C ions, Ge ions and N ions.

3. The method according to claim 1, wherein:
   a thickness of the anti-diffusion layer is in a range of approximately 10 Å-50 Å.

4. The method according to claim 1, wherein forming the anti-diffusion layer comprises:
   forming initial isolation structures with top surfaces below top surfaces of the fins; and
   performing an anti-diffusion ion implantation process on the initial isolation structures.

5. The method according to claim 4, wherein:
   an implanting dosage of the anti-diffusion ion implantation process is in a range of approximately $1.0 \times 10^{13}$ atoms/cm$^2$ $1.0 \times 10^{16}$ atoms/cm$^2$; and
   an implanting energy of the anti-diffusion ion implantation process is in a range of approximately 1 KeV-30 KeV.

6. The method according to claim 4, wherein forming the anti-punch through layer in the fins comprises:
   removing a partial thickness of the initial isolation structures to form isolation structures; and
   performing an anti-punch through ion implantation process on the isolation structures.

7. The method according to claim 6, wherein:
   the anti-punch through ions are carbon ions;
   an implanting energy of the anti-punch through ion implantation process is in a range of approximately $1.0 \times 10^{13}$ atoms/cm$^2$ $1.0 \times 10^{15}$ atoms/cm$^2$; and
   an implanting energy is in a range of approximately 5 KeV-100 KeV.

8. The method according to claim 6, wherein:
   the partial thickness is in a range of approximately 15 Å-60 Å.

9. The method according to claim 1, before forming the anti-diffusion layer and the anti-punch through layer, further comprising:
   forming isolation structures on the semiconductor substrate, a top surface of the isolation structures being below top surfaces of the fins.

10. The method according to claim 9, wherein forming the anti-punch through layer comprises:
    performing an anti-punch through ion implantation process to the isolation structures.

11. The method according to claim 9, further comprising:
    forming a doping layer having anti-diffusion ions on the isolation structures.

12. The method according to claim 11, wherein:
    the doping layer is formed by a chemical vapor deposition process; and
    the anti-diffusion ions are doped during the chemical vapor deposition process.

13. The method according to claim 11, wherein:
    the doping layer is made of silicon oxide having the anti-diffusion ions.

14. A semiconductor structure, comprising:
    a plurality of fins formed on a semiconductor substrate;
    a plurality of isolation structures formed between adjacent fins on the semiconductor substrate;
    an anti-diffusion layer, containing anti-diffusion ions, formed in the fins, wherein top surfaces of the isolation structures are coplanar with a bottom surface of the anti-diffusion layer; and
    an anti-punch through layer, containing anti-punch through ions, formed in the fins, a top surface of the anti-punch through layer being below a top surface of the anti-diffusion layer, and the anti-diffusion layer preventing the anti-punch through ions from diffusing toward tops of the fins.

15. The semiconductor structure according to claim 14, wherein:
    the anti-punch through ions include one or more type of C ions, Ge ions and N-type ions.

16. The semiconductor structure according to claim 14, wherein:
    a thickness of the anti-diffusion layer is in a range of approximately 10 Å-50 Å.

17. The semiconductor structure according to claim 14, wherein:
    a concentration of the anti-diffusion ions in the anti-diffusion layer is in a range of approximately $1.0 \times 10^{13}$ atoms/cm$^2$ $1.0 \times 10^{16}$ atoms/cm$^2$.

18. The semiconductor structure according to claim 14, further comprising:
    isolation structures formed on the base substrate among the fins.

19. A semiconductor structure, comprising:
    a plurality of fins formed on a semiconductor substrate;
    an anti-diffusion layer, containing anti-diffusion ions, formed in the fins; and
    an anti-punch through layer, containing anti-punch through ions, formed in the fins, a top surface of the anti-punch through layer being below a top surface of the anti-diffusion layer, and the anti-diffusion layer preventing the anti-punch through ions from diffusing toward tops of the fins, wherein:
    a thickness of the anti-punch through layer is in a range of approximately 20 Å-60 Å;
    the anti-punch through ions are one of P ions, As ions, B ions and F ions;
    a concentration of the anti-punch through ions is in a range of approximately $1.0 \times 10^{13}$ atoms/cm$^2$ $1.0 \times 10^{15}$ atoms/cm$^2$.

20. The semiconductor structure according to claim 19, wherein:
    the anti-punch through ions include one or more type of C ions, Ge ions and N-type ions.

* * * * *